United States Patent [19]
Masuda

[11] Patent Number: 5,257,231
[45] Date of Patent: Oct. 26, 1993

[54] SEMICUSTOM-MADE INTEGRATED CIRCUIT WITH BUILT-IN MEMORY UNIT ASSOCIATED WITH INTERNAL TIMING GENERATOR FOR INTERNAL WRITE ENABLE SIGNAL

[75] Inventor: Hajime Masuda, Tokyo, Japan

[73] Assignee: NEC Corporation, Tokyo, Japan

[21] Appl. No.: 748,716

[22] Filed: Aug. 22, 1991

[30] Foreign Application Priority Data

Aug. 22, 1990 [JP] Japan .................. 2-220201

[51] Int. Cl.⁵ .................. G11C 7/00; G11C 29/00
[52] U.S. Cl. .................. 365/201; 371/21.1
[58] Field of Search .............. 365/201; 371/21.1, 22.2, 371/22.5; 307/465

[56] References Cited

U.S. PATENT DOCUMENTS

| | | | |
|---|---|---|---|
| 4,670,877 | 7/1987 | Nishibe | 871/22.5 |
| 4,811,299 | 3/1989 | Miyazawa et al. | 371/21.1 |
| 4,969,148 | 11/1990 | Nadeau-Dostie et al. | 371/21.1 |

FOREIGN PATENT DOCUMENTS

| | | | |
|---|---|---|---|
| 0135883 | 6/1988 | Japan | 371/22.5 |
| 4-04028085 | 1/1992 | Japan | 365/201 |

*Primary Examiner*—Eugene R. LaRoche
*Assistant Examiner*—Son Dinh
*Attorney, Agent, or Firm*—Sughrue, Mion, Zinn Macpeak & Seas

[57] ABSTRACT

A semicustom-made integrated circuit with built-in memory unit is equipped with an internal timing generator located in the vicinity of the memory unit and responsive to two external controlling signals for producing an internal write enable signal used in a testing mode of operation, and the waveform of the internal write enable signal is hardly deformed on the way to the memory unit even if the signal propagation paths for the external controlling signals are prolonged due to increase of integration density, thereby enhancing the reliability of the testing operation.

3 Claims, 4 Drawing Sheets

SEMICUSTOM-MADE INTEGRATED CIRCUIT WITH BUILT-IN MEMORY UNIT ASSOCIATED WITH INTERNAL TIMING GENERATOR FOR INTERNAL WRITE ENABLE SIGNAL

FIELD OF THE INVENTION

This invention relates to a large scale semicustom-made integrated circuit with built-in memory unit and, more particularly, to an internal timing generator for producing an internal write enable signal used in a testing operation.

DESCRIPTION OF THE RELATED ART

A semicustom-made integrated circuit such as, for example, a gate array has found a wide variety of application, and some latest models of the gate array are integrated with memory units. A typical example of the gate array with built-in memory unit is illustrated in FIG. 1 of the drawings, and is fabricated on a single semiconductor chip 1. A gate array unit 1a and a memory unit 1b are integrated on the single semiconductor chip 1, and the memory unit 1b is subjected to a testing operation in the presence of a testing mode signal TM applied to an external controlling signal pin T1. Namely, if the testing mode signal TM is shifted to an active level, the memory unit 1b enters the testing mode, and an input data bit DTi at an input data pin T2 is written into a memory cell selected by an address signal (not shown) in the presence of an external write enable signal WEx of an active level at an external controlling signal pin T3. After the external write enable signal WEx is recovered from the active level to an inactive level, the data bit can be read out from the memory cell to an output data pin T4, and the output data signal DTo indicative of the data bit is examined to see whether or not any discrepancy takes place between the input data signal DTi and the output data signal DTo. If the output data signal DTo is consistent with the input data signal DTi, the memory cell subjected to the examination is of excellence. However, if not, a trouble takes place in the memory cell, and the memory cell can not be available. The examination is repeated for all of the memory cells incorporated in the memory unit 1b under the control of the external write enable signal WEx, and only excellent semicustom-made integrated circuit are delivered from the manufacturer.

The number of the logic gates incorporated in the gate array 1a has been increased from year to year, and the gate array tends to become versatile. This results in that the semiconductor chip 1 is enlarged, and, accordingly, the internal wirings tend to be prolonged. The prolonged internal wiring from the controlling signal pin T3 to the memory unit 1b deforms the waveform of the external write enable signal WEx, and rounds the edges. The external write enable signal WEx thus deformed is causative of an error in the write-in operation, and the error is mistaken for an inferior product. This means that excellent products are discarded through incredible testing operation.

In order to shrink the testing operation, the pulse width of the external write enable signal WEx tends to be decreased in the testing operation, and the problems due to the deformed write enable signal become serious.

SUMMARY OF THE INVENTION

It is therefore an important object of the present invention to provide a semicustom-made integrated circuit with built-in memory unit which is free from the problems due to the prolonged internal wiring.

To accomplish these objects, the present invention proposes to provide an internal timing generator in the vicinity of a memory unit for producing an internal write enable signal used in a testing mode of operation.

In accordance with the present invention, there is provided a semicustom-made integrated circuit fabricated on a single semiconductor chip, comprising: a) an array of cells associated with a predetermined wiring pattern for achieving a predetermined task; and b) a memory unit having a plurality of memory cells and selectively entering a testing mode and a usual mode of operation, the memory unit being associated with an internal timing generator located in the vicinity of the memory unit and responsive to external controlling signals for producing an internal write enable signal shiftable between an active level and an inactive level, a data bit being written into one of the plurality of memory cells while the internal write enable signal remains in the active level in the testing mode of operation, a data bit being read out from one of the plurality of memory cells while the internal write enable signal is in the inactive level in the testing mode of operation.

BRIEF DESCRIPTION OF THE DRAWINGS

The features and advantages of the semicustom-made integrated circuit with built-in memory unit according to the present invention will be more clearly understood from the following description taken in conjunction with the accompanying drawings in which.

DESCRIPTION OF THE PREFERRED EMBODIMENTS

First Embodiment

Figure 1:
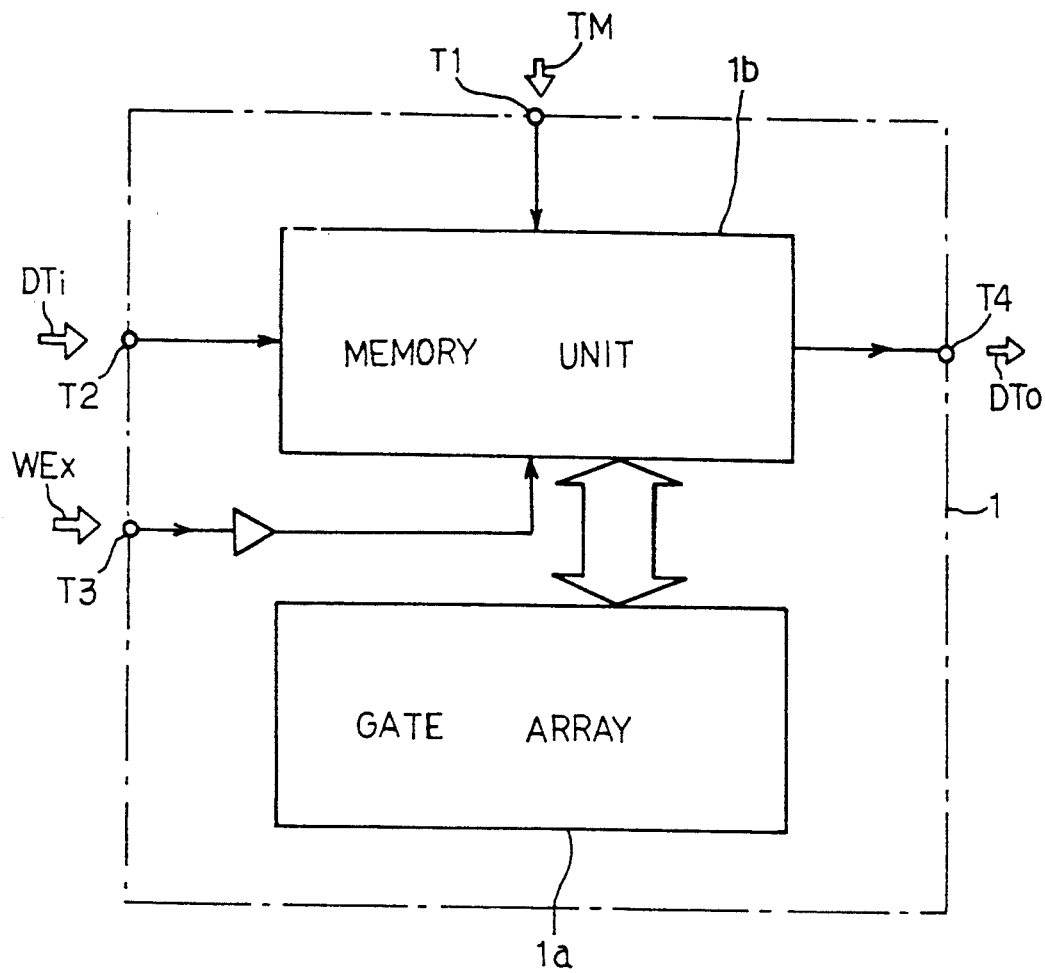
FIG. 1 is a block diagram showing the arrangement of the prior art gate array with built-in memory unit.
Figure 2:
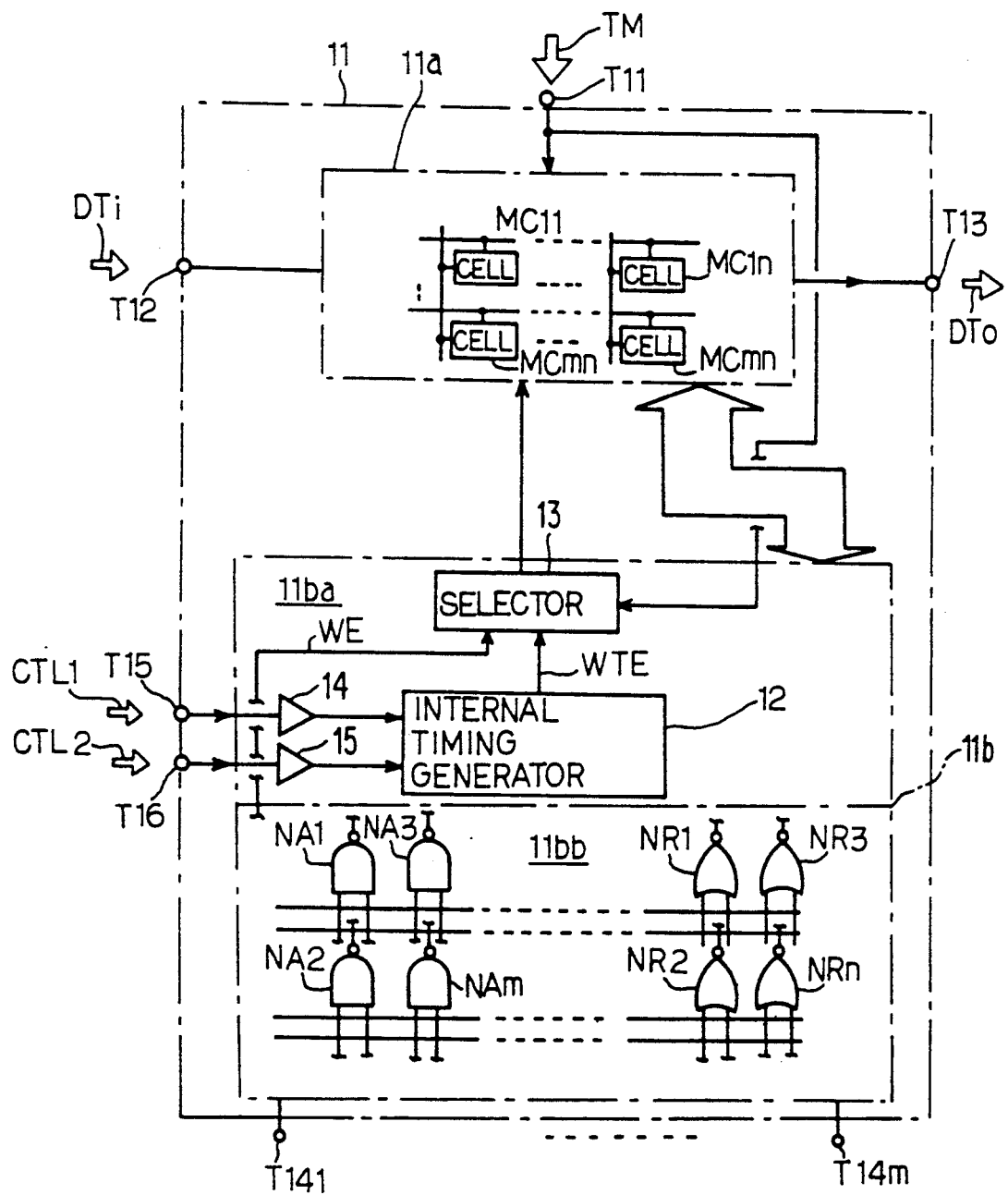
FIG. 2 is a block diagram showing the arrangement of a gate array with built-in memory unit according to the present invention.

Referring to FIG. 2 of the drawings, a semicustom-made integrated circuit with built-in memory unit is fabricated on a single semiconductor chip 11, and largely comprises a memory unit 11a and a gate array 11b. A plurality of memory cells MC11, MC1n, MCm1 and MCmn are incorporated in the memory unit 11a together with various peripheral circuits (not shown) such as, for example, a mode selector, a timing generator, an address decoder, a word line driver, sense amplifier circuits, an input data buffer, an output data buffer. However, the peripheral circuits are well known to a person skilled in the art, and no further description is incorporated hereinbelow.

The memory unit 11a selectively enters a testing mode and a usual mode of operation depending upon the logic level of a testing mode signal TM at a controlling signal pin T11. The memory unit 11a is further coupled to an input data pin T12 and an output data pin T13, and an input data signal DTi and an output data signal DTo are respectively supplied to the input data pin T12 and the output data pin T13, respectively.

In this instance, the memory unit 11a is assigned to an area adjacent to an area assigned the gate array 11b, and an internal timing generator 12 as well as a selector 13 are formed in an appropriate sub-area 11ba closer to the memory unit 11a rather than a sub-area 11bb. In the sub-area 11bb, predetermined electronic circuits are implemented by NAND gates NA1, NA2, NA3 and NAm as well as NOR gates NR1, NR2, NR3 and NRn, and achieve a predetermined task under communication with the memory unit 11a in the usual mode of operation. A large number of pins T141 to T14m are provided for the electronic circuits, and the internal timing generator 12 is closer to the memory unit 11a than any pin provided to the semicustom-made integrated circuit. In this instance, the NAND gates NA1 to NAm and the NOR gates NR1 to NRn serve as cells.

The internal timing generator 12 is coupled through input buffer circuits 14 and 15 to controlling signal pins T15 and T16, and first and second external controlling signals CTL1 and CTL2 are applied to the controlling signal pins T15 and T16 in the testing mode of operation. With the first and second controlling signals CTL1 and CTL2, the internal timing generator 12 produces a first internal write enable signal WTE, and the selector 13 transfers one of the first internal write enable signal WTE and a second internal write enable signal WE depending upon the mode of operation. Namely, the first internal write enable signal WE is transferred from the internal timing generator 12 to the memory unit 11a in the testing mode, and the second internal write enable signal WE is supplied from the gate array 11b to the memory unit 11a in the usual mode of operation.

Figure 3:
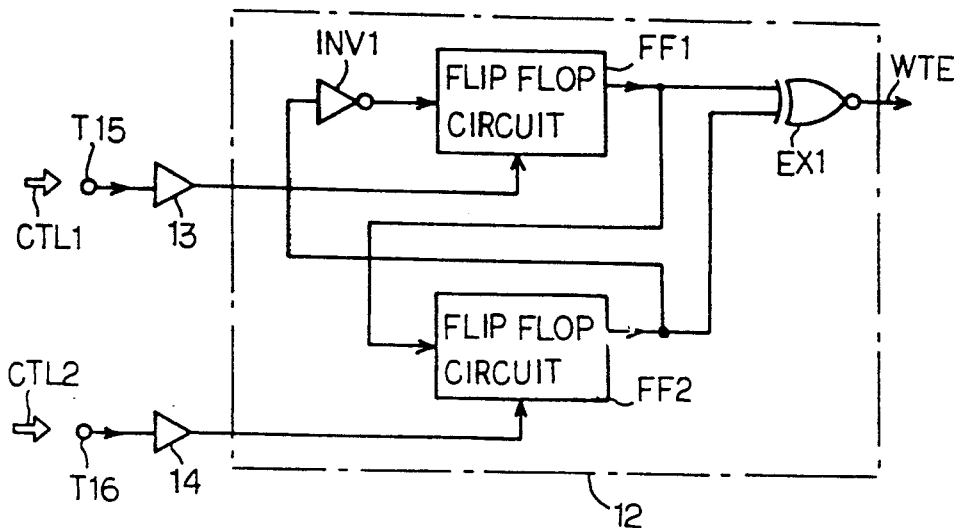
FIG. 3 is a circuit diagram showing the arrangement of an internal timing generator incorporated in the gate array shown in FIG. 2.

Turning to FIG. 3, the internal timing generator 12 is fabricated from two flip flop circuits FF1 and FF2, an inverting circuit INV1 and an exclusive-OR gate EX1. The input buffer circuits 14 and 15 supply the first and second controlling signals CTL1 and CTL2 to the clock nodes of the flip flop circuits FF1 and FF2, respectively. The output node of the flip flop circuit FF1 is coupled to the input node of the flip flop circuit FF2, and the output node of the flip flop circuit FF2 is coupled through an inverting circuit INV1 to the input node of the flip flop circuit FF1. The output nodes of the flip flop circuits FF1 and FF2 are further coupled to the input nodes of the exclusive-OR gate EX1, and the first internal write enable signal WTE is produced at the output node of the exclusive-OR gate EX1. The inverting circuit INV1, the flip flop circuits FF1 and FF2 and the exclusive OR gate EX1 are implemented by NAND gates and/or NOR gates formed in the sub-area 11ba.

Figure 4:
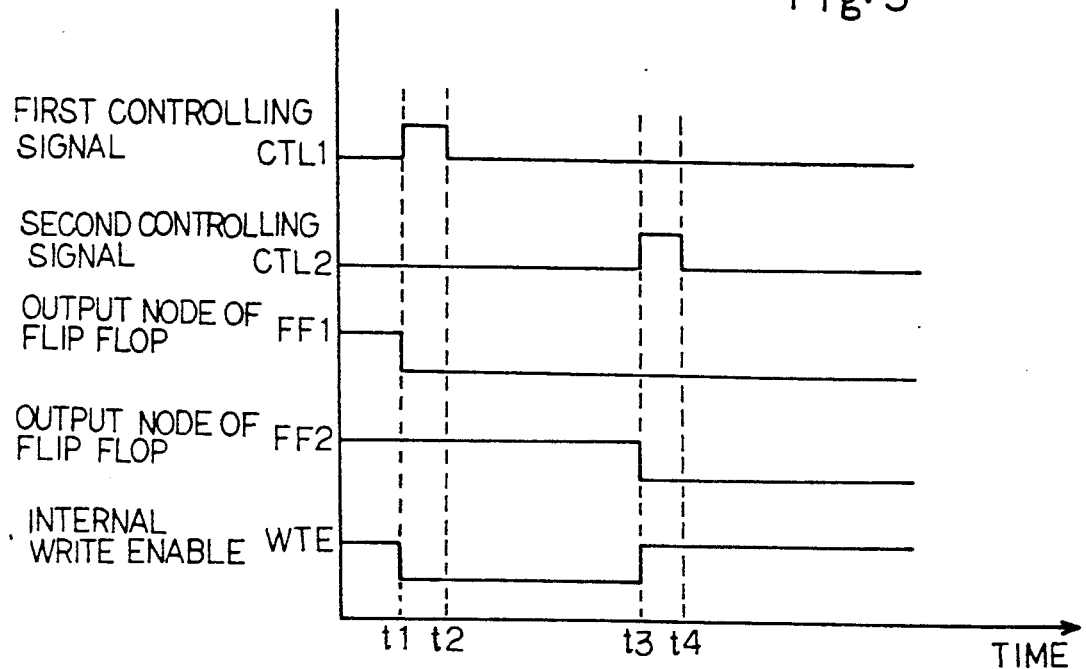
FIG. 4 is a diagram showing the waveforms of essential signals supplied to the internal timing generator.

The internal timing generator 12 thus arranged behaves in the testing mode as follows. Assuming now that both of the output nodes of the flip flop circuits FF1 and FF2 remain in logic "1" level, the exclusive-OR gate EX1 yields logic "1" level at the output node thereof, and the first internal write enable signal WTE is in an inactive high level (see FIG. 4). If the first controlling signal CTL1 goes up to the active high voltage level between time t1 and time t2, the flip flop circuit FF1 is triggered by the first controlling signal CTL1, and the low voltage level at the inverting circuit INV1 is latched by the flip flop circuit FF1. Then, the low voltage level or logic "0" level is supplied from the flip flop circuit FF1 to the exclusive-OR gate EX1. Since the input nodes of the exclusive-OR gate EX1 become different in logic level, the exclusive-OR gate EX1 shifts the output node thereof to logic "0" level, and the first internal write enable signal WTE goes down to an active low voltage level. While the first internal write enable signal WTE remains in the active low voltage level, a data bit indicated by the input data signal DTi is written into one of the memory cells MC11 to MCmn selected by an address signal (not shown).

The second controlling signal CTL2 is elevated to the high voltage level from time t3 to time t4, and the flip-flop circuit FF2 is triggered by the second controlling signal CTL2. The low voltage level has been supplied from the output node of the flip flop circuit FF1 to the input node of the flip flop circuit FF2, and the low voltage level is latched by the flip flop circuit FF2. Then, the flip flop circuit FF2 shifts the output node thereof to the low voltage level, and both of the input nodes of the exclusive-OR gate EX1 are consistent with each other. The exclusive-OR gate EX1 yields logic "1" level, and the first internal write enable signal WTE goes up to an inactive high level again. After recovery to the inactive high level, the data bit is read out from the memory cell to the output data pin T13, and the output data signal DTo is examined to see whether or not any discrepancy takes place between the input data signal DTi and the output data signal DTo. The first and second controlling signals CTL1 and CTL2 are periodically shifted between the high voltage level and the low voltage level, and the data bit is sequentially written into and read out from the memory unit 11a in the testing mode of operation as similar to the prior art memory unit 1b.

The internal wiring between the internal timing generator 12 and the memory unit 11a is short enough to prevent the first internal write enable signal WTE from undesirable deformation, and any error in the write-in operation hardly takes place. This means that excellent chips are never discarded as inferior products. The first internal write enable signal WTE free from deformation allows decreasing the pulse width thereof without any error in the write-in operation, and the amount of time period consumed can be decreased without deterioration of reliability of the testing operation.

Second Embodiment

Figure 5:
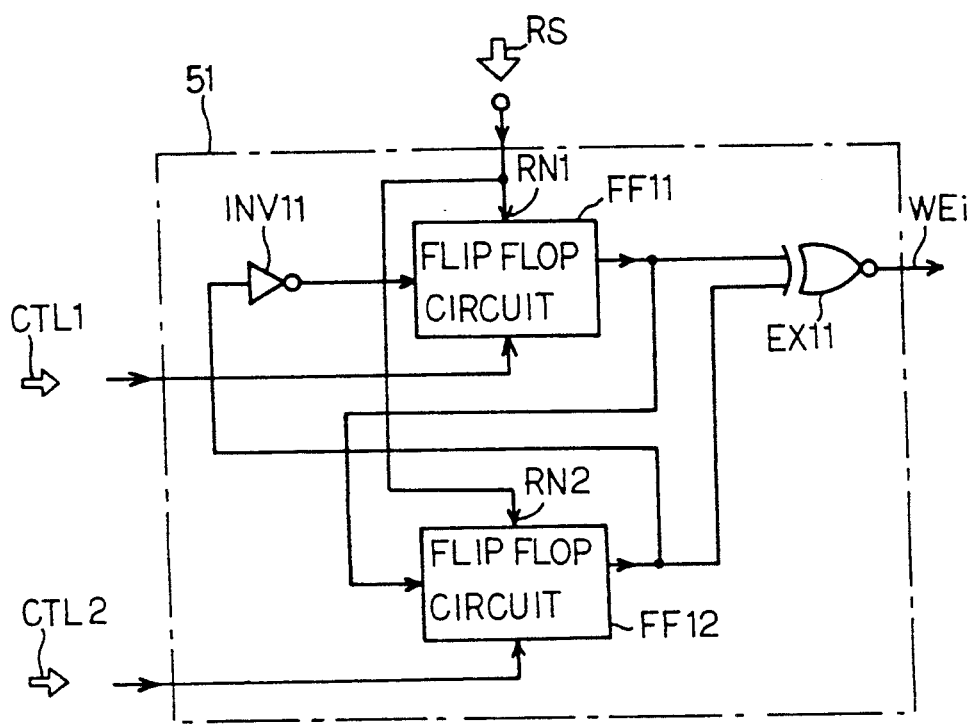
FIG. 5 is a diagram showing the arrangement of an internal timing generator incorporated in another semicustom-made integrated circuit according to the present invention.

Turning to FIG. 5 of the drawings, an internal timing generator 51 incorporated in another semicustom-made integrated circuit embodying the present invention is illustrated. The internal timing generator 51 is formed in an area located between a memory unit (not shown) corresponding to the memory unit 11a and a gate array (not shown) corresponding to the gate array 11b, and is, accordingly, closer to the memory unit than controlling signal pins.

The internal timing generator 51 comprises two flip flop circuits FF11 and FF12, an inverting circuit INV11, and an exclusive-OR gate EX11, and the flip flop circuits FF11 and FF12 have respective reset nodes RN1 and RN2. The connections therebetween are similar to that of the first embodiment except for the reset nodes RN1 and RN2, and a reset signal RS is supplied to the reset nodes RN1 and RN2 upon activation of the semicustom-made integrated circuit. If no reset signal is supplied to the flip flop circuits FF11 and FF12, the output nodes of the flip flop circuits FF11 and FF12 are hardly expectable, and the first write enable signal WEi may be different in width from the succeeding internal write enable signals WEi. However, all of the internal write enable signals WEi produced by the internal timing generator 51 are constant in width, and reliability of the testing operation is further enhanced.

Although particular embodiments of the present invention have been shown and described, it will be obvious to those skilled in the art that various changes and modifications may be made without departing from the spirit and scope of the present invention. For example, the present invention is applicable to another semicustom-made integrated circuit with built-in memory unit such as, for example, a standard cell. In the first and second embodiments, the first internal write enable signals are used in the testing operations, and the second internal write enable signals are applied to the memory units in the practical usages. However, the first internal write enable signal may be used in not only the testing operation but also practical applications. Such a dual usage may be convenient for a data source incorporated in the semicustom-made integrated circuit.

What is claimed is:

1. A semicustom-made integrated circuit fabricated on a single semiconductor chip, comprising:
    a) an array of cells associated with a predetermined wiring pattern for achieving a predetermined task; and
    b) a memory unit having a plurality of memory cells and selectively entering a testing mode and a usual mode of operation, said memory unit being associated with an internal timing generator located in the vicinity of said memory unit and responsive to external controlling signals for producing an internal write enable signal shiftable between an active level and an inactive level, a data bit being written into one of said plurality of memory cells while said internal write enable signal remains in said active level in said testing mode of operation, a data bit being read out from one of said plurality of memory cells while said internal write enable signal is in said inactive level in said testing mode of operation, said internal timing generator comprising c-1) a first flip flop circuit having an input node coupled to the output node of a first inverting circuit, a clock node supplied with one of said external controlling signals for memorizing a logic level at the input node thereof, and an output node, c-2) a second flip flop circuit having an input node coupled to the output node of said first flip flop circuit, a clock node supplied with the other of said external controlling signals for memorizing a logic level at the input node thereof, and an output node coupled to the input node of said first inverting circuit, and c-3) an exclusive-OR gate having two input nodes respectively coupled to the output nodes of said first and second flip flop circuits.

2. A semicustom-made integrated circuit as set forth in claim 1, in which said first and second flip flop circuits have respective rest nodes where a reset signal is supplied upon activation of said semicustom-made integrated circuit.

3. A semicustom-made integrated circuit as set forth in claim 1, in which said array of cells is implemented by a gate array.

* * * * *